United States Patent
Julian et al.

[11] Patent Number: 5,945,605
[45] Date of Patent: Aug. 31, 1999

[54] SENSOR ASSEMBLY WITH SENSOR BOSS MOUNTED ON SUBSTRATE

[75] Inventors: Francis S. Julian; Raymond P. Hui, both of San Jose; James H. Hoffman, Santa Clara; Christos D. Cartsonas, Menlo Park, all of Calif.

[73] Assignee: SenSym, Inc., Milpitas, Calif.

[21] Appl. No.: 08/974,005

[22] Filed: Nov. 19, 1997

[51] Int. Cl.⁶ .............................. G01L 9/04; G01L 9/06
[52] U.S. Cl. .............................. 73/727; 73/726; 257/419; 257/420; 438/53
[58] Field of Search ........................ 73/727, 726, 861.47, 73/493, 724; 374/147, 178; 257/419, 420; 438/50, 51, 52, 53; 361/283.4; 338/42

[56] References Cited

U.S. PATENT DOCUMENTS

| | | | |
|---|---|---|---|
| 4,382,247 | 5/1983 | Stecher et al. | 338/42 |
| 5,067,491 | 11/1991 | Taylor, II et al. | 128/748 |
| 5,257,547 | 11/1993 | Boyer | 73/756 |
| 5,273,939 | 12/1993 | Becker et al. | 438/51 X |
| 5,483,994 | 1/1996 | Maurer | 138/31 |
| 5,515,732 | 5/1996 | Willcox et al. | 73/724 |
| 5,635,649 | 6/1997 | Tobita et al. | 73/726 X |

Primary Examiner—Joseph L. Felber
Attorney, Agent, or Firm—Skjerven, Morrill, MacPherson, Franklin & Friel LLP; Norman R. Klivans

[57] ABSTRACT

A non-invasive sensor assembly device includes a pedestal mounted sensor die for stress isolation of the sensor die from external stresses, a substrate and die porting configuration to limit exposure of the sensor assembly to only the interior of the sensor die and a connecting tube to provide significant isolation of the sensor assembly and its constituent parts from the fluid stream, and an inert coating conformally deposited on the inside surfaces of the die, pedestal, and connecting tube that are in contact with the fluid media to thereby provide complete isolation of the sensor assembly from the media. The pedestal is fabricated on the substrate by screening multiple layers of conductive ink on the substrate, flashing off the solvents, and firing the substrate to burn off the binders to provide a boss of sufficient height such that the sensor die, once mounted on the boss, is substantially isolated from the substrate and, therefore, from included stresses that might otherwise have been transferred to the die from the substrate. The contact area of the boss with the die is optimally selected to provide maximum stress isolation and sufficient mounting strength. A through hole in the substrate and through the longitudinal center of the boss is in cooperative coaxial alignment with a fluid entry port in the die to permit measurement of the physical characteristic of interest within the interior of the die.

23 Claims, 3 Drawing Sheets

SENSOR ASSEMBLY WITH SENSOR BOSS MOUNTED ON SUBSTRATE

BACKGROUND OF THE INVENTION

1. Field of the Invention

The present invention relates to a sensor assembly. More specifically, this invention relates to a non-invasive, media isolated, and stress isolated pedestal mounted sensor die exhibiting improved sensitivity, and reduced measurement error caused by induced substrate stress, and enhanced media isolation, and method therefore.

2. Description of the Related Art

Sensors convert the absolute value or change in a physical quantity such as temperature, pressure, flow rates, pH, and the like into a useful input signal, typically electrical signals, for an information-gathering system to permit measurement and control of the environment in which that sensor is located. The particular physical parameter to be measured generally dictates the type of sensor to be used. For example, a pressure sensor is typified by a piezoresistive element disposed on or incorporated into a flexible diaphragm integrated into the sensor die. Stress caused from a pressure differential across the diaphragm causes the diaphragm to deform resulting in a measurable change in the resistance of the piezoresistive element, thereby permitting calculation of the pressure. Flow rate sensors may similarly employ a piezoresistive strain gauge for measuring the flowrate of a gas or liquid stream (i.e., a fluid stream). These sensors are typically inserted into the liquid or gas stream for which a measurement is desired.

Sensors are typically inserted directly into the media, or fluid, stream whereby contemporaneous measurements of pressure, temperature, flow rates, and the like may be made as the values for these parameters change. However, these invasive measurements of physical parameters may place special demands on a sensor, particularly where the temperature, corrosivity, or solvating capacity of the media are incompatible with the sensor assembly construction and/or components. Chemical incompatibility may limit, or completely deny, the use of a particular sensor where the media may result in destruction of the sensor. For example, a sensor used to measure the pressure or flow rate of a hot solvent may be short-lived in view of the various soluble components which may comprise the sensor assembly, particularly glues, epoxies, plastic components, and the like. Similarly, a corrosive media may result in oxidation and destruction of the organic and metal components of the sensor.

The temperature of the media is another environmental factor that may affect the performance of a sensor. The problem of temperature and temperature differentials and their resulting stresses generate a strain in the sensor assembly causing errors in the measurement, and reducing the sensitivity of the measurement. Generally, temperature compensation circuits are employed to improve the precision of the sensor measurement. However, those additional components comprising the temperature compensation circuit, as well as the conductive traces interconnecting these components, are susceptible to attack by both solvents, corrosive media, and high temperatures. Moreover, the stress associated with differences in thermal expansion coefficients between the various dissimilar materials from which a sensor assembly is constructed inevitably leads to strain across the piezoresistive element, resulting in errors such as offset bias, and response slope errors.

The means by which a sensor die is attached to the substrate also affects the performance of the sensor. Sensors presently available disfavor a "hard" attachment, i.e., a soldered junction, between the sensor die and the substrate. Hard attachments are considered mechanically unstable, and result in performance problems caused by so-called material creep. The resulting stresses are transmitted from the substrate to the sensor element and render the performance of the sensor unstable. Accordingly, sensors presently available are typified by a "soft" attachment whereby an adhesive, such as epoxy adhesives or silicon adhesives, is used to attach the sensor die to the substrate. These soft attachment assemblies, however, are unsuitable in corrosive environments and are unable to tolerate temperature extremes, becoming brittle at low temperatures. Even where a protective coating is applied over the adhesive, any pinholes in the coating will permit a corrosive fluid, such as an acid, or acidic gas, to attack the adhesive resulting in a sensor failure within a short period of time.

Various attempts have been made by those practicing in the art to address the problems associated with a hostile sensor environment. Boyer, in U.S. Pat. No. 5,257,747, issued Nov. 20, 1993 discloses a pressure transducer comprising a pressure sensor mounted to a buffer plate, which in turn is mounted to a ceramic plate. The ceramic plate is supported within a housing, and is separated from all parts of the housing except for a central surface on a support boss. A cover is attached to the housing. The housing and cap are constructed to provide offset positioning of the housing with respect to an external device to isolate the housing from sources of external stress. While this configuration may provide some stress isolation from forces occurring external to the housing, it does not provide for stress isolation of the sensor from the ceramic substrate. The sensor is bonded by substantially its entire surface area to the buffer plate which in turn is bonded by substantially its entire surface area to the ceramic substrate. Although Boyer teaches a flexible adhesive to permit relative movement of the ceramic substrate to the sensor die, any stress resulting from temperature differentials between various areas of the ceramic plate, or resulting from temperature differentials between the media being sampled and the ceramic plate are easily transmitted through the flexible bonds and to the sensor. Moreover, the sensor, buffer plate, and mounting cement are exposed to the fluid media, thus providing no isolation from the media. Since Boyer's flexible media suggests an organic adhesive, even were a protective coating applied to the exposed areas of the sensor, any leaks or pinholes in the coating renders the mounting adhesive susceptible to chemical oxidation and degradation from corrosive and solvating media.

U.S. Pat. No. 5,483,994, issued to Maurer on Jan. 6, 1996 discloses a pressure sensor comprising a dual chamber divided by a flexible membrane. Fluid is introduced into the first chamber, thereby deforming the flexible membrane. A plunger having an elongated stem is disposed in the second chamber and is responsive to the membrane movement. The distal end of the plunger stem is in contact with a pressure sensor. As the fluid pressure increases, the membrane presses against the plunger, whose stem presses against the sensor thereby providing an indication of the fluid pressure. While the fluid is isolated from the sensor by the membrane and plunger, critical tolerances must be adhered to ensure that the plunger and stem just touch the membrane and sensor at all times to provide sensitivity at low pressures. If the plunger and stem are too short (for example, contraction of the stem in cold weather), there is a latency, and a threshold pressure must be exerted before the stem contacts and presses against the sensor. Moreover, in view of the thermal expansion of the plunger and stem, high temperature environments may cause elongation of the plunger and result in a stress on the sensor stem creating an erroneous offset pressure signal. Finally, Maurer's device does not provide a means for isolating the sensor from external stresses. As shown, a conductive seal is disposed directly below the sensor die, and a die support is disposed directly above the sensor die, thus placing the sensor die in intimate physical conduct with the sensor body, or housing, resulting in significant exposure to stresses caused by thermal and external forces.

U.S. Pat. No. 5,067,491, issued to Taylor, II et al. on Nov. 26, 1991 is directed to a media isolated sensor probe mounted on a catheter adapted for invasive insertion into, and monitoring of, a patient's blood stream. The sensor element and catheter are coated with a thin layer of polymer to provide media isolation, thus isolating the sensor and catheter from bioreactive and other deleterious materials in the blood stream. Moreover, since Taylor's probe must be inserted in its entirety into the fluid (i.e., the bloodstream), the size of the probe must remain small, thus Taylor does not provide for stress isolation of the sensing element.

The devices of the prior art fall short of providing a sensor assembly having both stress isolation and media isolation. There is a need for a sensor assembly for non-invasive monitoring of physical parameters associated with a liquid or gas stream that provides both stress isolation and media isolation of the sensor assembly to permit both greater sensitivity and reliability.

SUMMARY

In accordance with the present invention, a sensor assembly includes at least a substrate, a sensor die mounted on a pedestal disposed on the substrate, a housing for containing the die and substrate, and the appropriate electrical connections and terminations to permit electrical communication with the sensor assembly.

The sensor die of the device of this invention conventionally includes a die body whereby measurements are taken by media (i.e., liquids or gases) introduced to a hollow region in the sensor die body. The die body is micromachined, or etched, to provide the hollow region and is, accordingly, composed of a material permitting such processing. In one embodiment, a top surface of the die body includes a diaphragm having disposed thereon a piezoresistive sensing element for measuring deformation strain of the diaphragm responsive to fluid pressure inside the hollow region. Other embodiments may include sensing elements disposed in the die, with or without a diaphragm, in accordance with the character of the parameter to be measured. For example, a pyroelectric element may be used without a diaphragm to directly measure the fluid's temperature, or a piezoelectric sensor may be used to measure pressure waves and the like. The sensor die containing these piezoelectric and pyroelectric sensors is in fixed, remote spatial alignment with the substrate to substantially reduce stresses on the sensor die originating from thermal or other external forces on the die which may alter the sensor response characteristics thereby affecting its precision and response slope.

Alternately, fluid pressure may be measured using a capacitive sensor wherein a dielectric thickness changes responsive to the fluid pressure. In this case, an electrically conductive membrane is spatially, parallel disposed opposite a rigid conductive wall of the sensor die, the electrically conductive membrane and wall being electrically isolated from each other and having a dielectric disposed between them to provide a capacitive sensor. Stresses on this type of sensor originating from thermal or external forces on the die may create a strain thereby altering the response characteristic of the capacitor to adversely affect its precision and response slope.

The substrate may be comprised of any material having acceptable machinability, thermal expansion, and insulating characteristics, including ceramic, glass, thermoplastics, quartz and the like. In one embodiment of the sensor assembly of this invention, the substrate is a ceramic, available from Coors Ceramic, Grand Junction Colo.

In accordance with a first aspect of this invention, the sensor die is isolated from stresses resulting from external forces by mounting the die on a raised pedestal disposed on the substrate. By so doing, the die is remotely mounted above the surface of the substrate. The area by which the die is mounted uses only a small portion of the bottom surface area of the die. This substantially isolates the die from the substrate except for the small area associated with the top surface of the substrate pedestal upon which the die is mounted. The small contact area between the die and the pedestal substantially eliminates the transfer of stresses to the die resulting from thermal differences between the die and the substrate, thermal differences between different regions on the substrate, and from other external forces, such as physical deformation or uneven thermal expansion of the sensor assembly housing. On the other hand, the contact area between the die and the substrate pedestal is sufficiently large to provide a bond sufficiently strong to result in permanent mounting of the die to the pedestal.

We have discovered that the substrate pedestal may be fabricated by printing multiple layers of screenable ink or paste, in particular an electrically conductive ink, onto the substrate to build up and provide a boss at the pre-selected substrate location. The method of this invention provides a substrate having a pedestal having a small pedestal/sensor die contact area, and a height sufficient to isolate the die from the substrate to prevent the transfer of substrate stresses to the sensor die. This method advantageously provides a high throughput, high yield process for providing substrates having a rigid pedestal for mounting a sensor die thereon. Moreover, since the substrate process generally includes screening the substrate with electrically conductive ink (to provide mounting pads and traces for other components and for electrical connections), only minimal process steps, and no additional unit operations, are needed to accommodate constructing the pedestal. Alternately, a pedestal may be built up of any material capable of being screened or applied onto the substrate, including a screenable ceramic, a screenable glass, a ceramic or metal spacer, and the like. In one embodiment, a "dead-end" sensor assembly (i.e., a single-ported die) is provided by providing a through-hole through the substrate and centrally along the longitudinal axis of the pedestal. The through-hole is in cooperative coaxial alignment with a fluid entry port in the bottom surface of the die where it is connected to the pedestal to permit fluid to enter through the substrate and pedestal and into the hollow region of the die to contact the sensor element disposed therein. A soldering pad may optionally be provided on the bottom surface of the substrate, opposite the pedestal, and annularly disposed about the through hole, to permit solder attachment of a sampling tube to the sensor assembly to facilitate connection to an external fluid media stream.

In another embodiment a "flow-through" sensor is fabricated by providing a sensor die having fluid entry and exit ports, and a substrate having fluid entry and exit through-holes. The through-holes are in cooperative coaxial alignment with the entry and exit ports, and may be disposed within sufficient proximity to one another to permit only a single pedestal upon which the flow-through sensor die might be attached, yet still requiring only a small portion of the bottom surface are of the die to be bonded. Alternately, a pair of pedestals proximal to one another may be provided. Ideally, the total bonding area should remain approximately equal to the bonding area associated with a single pedestal.

We have discovered that a "hard" attachment of the die to the substrate pedestal may be made without the resulting transmission of stresses from the substrate to the sensor die as is experienced in the sensors of the prior art. A high temperature solder may be used, such as an indium-based solder to attach the sensor die to the pedestal. A solder having a higher melting point permits subsequent solder operations (such as attachment of a fluid sampling tube), using a lower temperature solder without risk of de-soldering the die from the pedestal. A soldering pad is provided on the bottom surface of the die, and annularly disposed about the fluid port, to provide the means by which the solder will adhere to the die. The soldering pad on the die may be applied during the fabrication of the die sensor using well known sputtering techniques. The material used to form the soldering pad is typically a chromium-nickel-gold film, however, other metals, and their associated deposition techniques, known to those practicing in the art, may be used as well. Advantageously, a hard attachment as described is not susceptible to chemical attack by solvent fluid streams. Moreover, once the inside surfaces of the die, the through-holes, and optionally the sampling tube, have been coated with a chemically inert film, any small pinhole leaks in that film are less likely to result in destruction or impairment of the sensor assembly.

Alternately, a "soft" attachment may be used, such as an epoxy adhesive, to bond the sensor die to the substrate pedestal. However, we have discovered that the use of epoxy to bond the die to the pedestal results in aggravated errors due to differential thermal expansion between the substrate, the epoxy, and the die, resulting in response curves that are more non-linear as compared to a hard attachment. Moreover, epoxies are brittle at low temperatures, and may result in detachment of the sensor die from the pedestal.

In accordance with a second aspect of the sensor assembly of this invention, a protective coating is applied to the inside surfaces of the sensor die, the through hole, and optionally, the sampling tube to completely isolate these small portions of the sensor assembly of this invention from the fluid whose properties are being measured. Various materials may be used to provide an internal coating and are well known by those practicing in the art. In one embodiment, a commercially available dimer, parylene, is used to provide a conformal coating at least 2000 Å thick, and nominally about 9000 Å thick to the inside surfaces of the sensor die, the through-holes, and optionally the sampling tube. This barrier coating exhibits low permeability to moisture and gases, and resists attack from acids and bases. Moreover, parylene is able to operate over a wide temperature range, and is a stress free coating, thus not aggravating stress induced errors. Other barrier coatings include silicon dioxide, silicon nitride, and fluorocarbon polymers.

In accordance with the method of this invention, a process for manufacturing the sensor assembly of this invention includes fabricating a sensor die, fabricating a substrate having thereon a pedestal to which the sensor die is mounted to provide a sensor assembly, coating all interior surfaces of the sensor assembly to completely isolate the sensor from the media being sampled, and assembling the sensor assembly into a housing to provide a sensor module.

In accordance with one aspect of this invention, a substrate is provided, and includes a boss, or pedestal, portion upon which the sensor die is mounted. In one embodiment, the substrate is a ceramic material although glass, quartz, and the like may also be used. Appropriate metal pads and traces are provided on the ceramic substrate to accommodate various circuit components which may optionally be desired, for example, a temperature compensation circuit. These conductive pads and traces are typically applied using a conductive ink that is screened onto the substrate. A conductive ink appropriate for use in practicing this invention may be obtained from Dupont, Research Triangle Park, N.C. Advantageously, the pedestal upon which the sensor die is mounted may be fabricated by screening multiple layers of the conductive ink onto the ceramic substrate until an amount sufficient to separate the as-mounted sensor die from the substrate by at least 50 $\mu$m is deposited. Using the conductive ink for fabricating the pedestal, as well as for producing the conductive pads and circuit traces, requires no additional process operations and significantly increases the throughput and yield of substrate production as compared to a substrate process involving, for example, micromachining the pedestal from the ceramic material.

The sensor die may be fabricated using well known semiconductor manufacturing techniques particularly where the sensor is diffused into the die material, thus requiring that the die be built from a semiconductor material. In one embodiment, the sensor die comprises two halves. The first, or lower half, the constraint die, includes the fluid port (or ports if a flow through sensor is desired), and a glass frit. The bottom surface of the constraint die is provided with a soldering pad disposed annularly about the fluid port(s) to provide a base by which the die may be bonded, preferably soldered, to the substrate pedestal. The second, or upper half, the active die, contains a hollow region etched out of the die to accommodate the fluid. Pressure measurements include an active die with a thin diaphragm fabricated in its top surface. A piezoresistive element is diffused into the diaphragm. Other sensor types, not requiring a flexible diaphragm may necessarily require alternative structures to the active die. These structures, and their fabrication, are well known to those practicing in the art. The glass frit disposed on the top surface of the constraint die permits the two halves of the die to be fused together to provide the finished sensor die. Advantageously, a plurality of the constraint dies and active dies may be fabricated in a semiconductor wafer, such as silicon, to permit manufacturing according to well known and established techniques. Once the two wafers representing the two halves of the sensor are joined, the individual sensors may be sawn off.

The die is mounted to the pedestal using either a solder or adhesive. In one embodiment, the solder is a high temperature indium-based solder capable of providing a strong bond, and able to withstand the temperatures associated with later soldering of the sampling tube to the substrate, and to the temperatures associated with deposition of a prophylactic coating. Fluid conveyance through holes in the substrate are carefully lined up with fluid entry and exit holes in the die prior to bonding to ensure fluid entry into the hollow region within the sensor die. A hard solder joint is advantageously used where a solvent or corrosive liquid or gas stream that might otherwise degrade an organic adhesive.

A barrier coating may be deposited onto all inside surfaces, including the inside surfaces of the sensor die, the glass joint, the indium solder joint and the inside walls of the substrate through-holes and solder joint. These include all surfaces that may be exposed to the fluid media whose physical characteristic is to be measured. Even though the device of this invention utilizes materials at the media-sensor interface that are not readily attacked by solvents or corrosive fluids, i.e., silicon, glass, indium solder, and ceramic, the barrier coating provides 100% media isolation of the sensor assembly. Should pinholes in the barrier coating permit some fluid to contact these materials, no significant degradation is expected. Optionally, the sample tube may be soldered to the bottom surface of the substrate prior to application of the barrier coating so that the inside of the sampling tube may also be coated. A soldering pad is provided to the bottom surface of the constraint die during the conductive ink screening step to provide a metal surface to which the mouth of the sampling tube may be soldered. The sample tube is ideally fabricated from a non-corrosive material such as stainless steel, or nickel, or is plated to provide a non-corroding surface.

Final assembly of the sensor device of this invention includes bonding the sensor die leads to the appropriate metal pads printed on the substrate, installing any additional electronic components such as amplifiers or temperature compensation circuits to the substrate, and attaching a protective housing onto the ceramic substrate. The housing is ideally constructed from the same material as the substrate, or optionally a material having the same coefficient of thermal expansion, thus eliminating induced stress in the substrate originating from forces in the housing.

BRIEF DESCRIPTION OF THE DRAWINGS

The present invention may be better understood, and its numerous objects, features, and advantages made apparent to those skilled in the art by reference to the accompanying drawings.

The use of the same reference symbols in different drawings indicates similar or identical items.

DETAILED DESCRIPTION

While the invention is described hereinbelow with reference to certain illustrated embodiments, it is understood that these embodiments are presented by way of example and not by way of limitation. The intent of the following detailed description is to cover all modifications, alternatives and equivalents as may fall within the spirit and scope of the invention as defined by the appended claims. For example, it is understood by a person of ordinary skill practicing the device of this invention that the sensor die may be constructed using various active sensing elements and includes flow-through sensors, as well as dead-end sensors. Accordingly, the following detailed description is directed to a pressure sensor assembly, not by way of limitation, but rather to present by way of illustration and particular clarity that which we feel is the subject matter of our invention.

Figure 1:
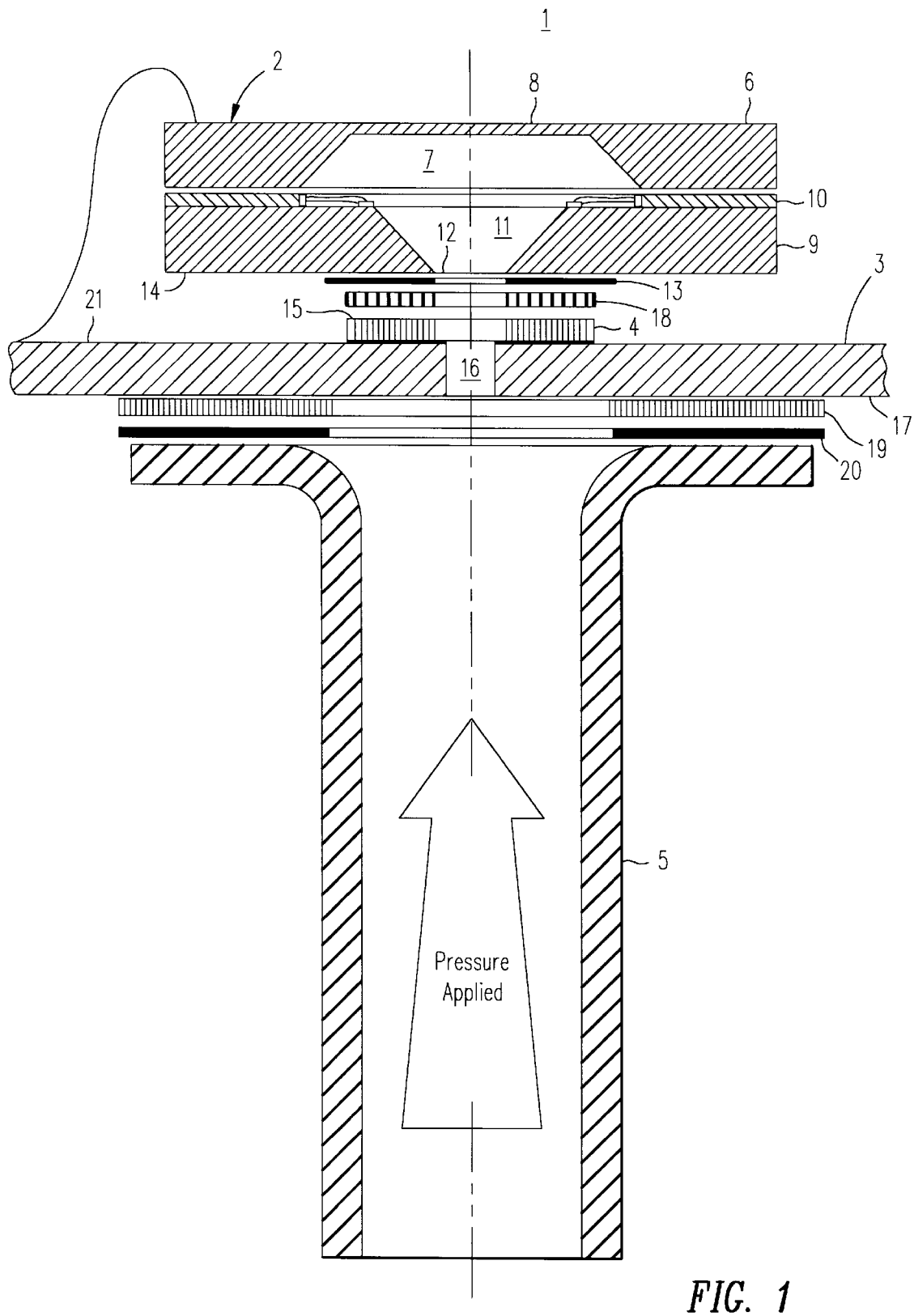
FIG. 1 is a cross section diagram of the sensor assembly of the present invention.

Turning now to the drawings, and in particular to FIG. 1, a cross section of a pressure sensor assembly 1 embodying the inventive elements of the present invention is shown. FIG. 1 is partially exploded to better illustrate the layered construction of the sensor assembly. The sensor assembly includes a sensor die 2, a substrate 3 having thereon a pedestal 4 upon which the sensor die 2 is mounted, and a sampling tube 5.

The die 2 is conventionally fabricated from a semiconductor substrate material, for example silicon, and is advantageously produced as a plurality of dies on a semiconductor wafer. Other materials amenable to photolithographic processing are appropriately used depending upon whether the sensing element (i.e., transducer) is to be fabricated as an integral part of the die, or whether it will be bonded to the die after fabrication. Where the sensing element is bonded as a separate structure, nonsemiconducting materials may be used to produce the sensor die. It is also understood by those practicing in the art that the flexible diaphragm associated with a sensor die as shown in FIG. 1 need not be fabricated integral to the active die, but optionally, may be later attached as a separate diaphragm structure such as glass, rubber, and the like.

The sensor die 2 shown in FIG. 1 comprises a top half, or active die 6 portion, having a hollow region 7 etched therein to provide a reservoir for holding the media and to provide a flexible diaphragm 8, upon which a piezoresistive element is fabricated (not shown). The piezoresistive transducer element is preferably positioned on the out side surface of the flexible diaphragm to provide isolation of the transducer from the media. It is understood that the transducer may be positioned on or in the sensor die so long as the transducer is responsive to the media's characteristic of interest. In the embodiment shown in FIG. 1, media pressure in the hollow region 7 of the sensor die distorts the flexible diaphragm causing the piezoresistive element to change resistance, thus permitting a pressure indication in the form of a voltage drop, or current increase, across the piezoresistive transducer element.

A lower half, the constraint die 9 includes a thin glass frit 10 disposed on the upper surface of the constraint die. After etching, the constraint die includes a hollow region 11 and a port 12 through which the media may enter the interior region of the assembled sensor die. A metal bonding pad 13, such as a layered chromium-nickel-gold composite is sputtered onto the bottom surface 14 of the constraint die 9 in a small area around the port hole 12 to permit solder bonding the sensor die 2 to a distal surface 15 on the pedestal of the substrate. The metal is advantageously patterned onto the bottom surface 14 of the constraint die so that only a small area of metal surrounding the port hole 12 is left on the die. Once the die halves 6 and 9 have been etched, the active die 6 is overlaid on the glass frit 10 of the constraint die 9 whereby the glass frit seals the active die to the constraint die.

Continuing to refer to FIG. 1, a substrate 3 having a raised pedestal 4, or boss, is provided upon which the sensor die 2 is mounted. The boss is constructed from a plurality of printed layers (not shown) to a diameter and a relief height sufficient to stress isolate the sensor die from induced substrate stresses. The printable material includes sinterable or thermosetting materials such as any conductive, or non-conductive, ink or paste, including metal inks and pastes, and ceramic-based inks and pastes, and thermosetting polymers. In one embodiment the boss 4 is constructed of at least three layers of printed conductive ink to provide a pedestal 4 having a relief of at least approximately about 50 $\mu$m (microns), and preferably 75 $\mu$m or greater. The diameter of the boss is such that the area of contact with the bottom surface 14 of the constraint die 9 is less than 50% and typically approximately 25% of the total bottom surface area.

A conductive metal ink is advantageously used to fabricate the layers comprising the pedestal 4 since the same ink can be used to fabricate the various metal pads and traces disposed elsewhere on the substrate 3 upon which various electronic components can be mounted and interconnected. As a result, no additional process steps are required in order to construct the substrate pedestal. Moreover, the resulting metal pedestal obtained after the printed conducted ink is fired (to remove solvents and binders) provides a metallic distal surface 15 onto which the sensor die 2 may be directly soldered. In an alternate embodiment wherein a non-metallic, ceramic ink or paste is used to construct the pedestal 4, a final layer of conductive ink is printed on the pedestal to provide a metallic distal surface 15 so that the sensor die 2 may be solder bonded to the pedestal 4.

A through-hole 16 extending from a bottom surface 17 of the substrate 3, and centrally through the pedestal 4 is provided. The sensor die 2 is mounted so that the through-hole 16 and the sensor die port 12 are in coaxial alignment permitting fluid communication from the through-hole 16 to the hollow region 7 of the sensor die 2.

A high temperature solder 18, such as an indium-based solder, is used to bond the sensor die 2 to the pedestal 4. A higher temperature solder advantageously permits subsequent process steps involving relatively lower temperatures to be performed without destroying the solder bond between the pedestal 4 and the sensor bottom surface 14. The indium solder may be printed on the distal surface 15 of the pedestal 4 as a final layer, or it may be dispensed in paste form through a syringe onto the distal surface 15 of the pedestal. In either case, the sensor die is aligned onto the pedestal so that the port and the through hole are coaxially aligned. The die/substrate assembly is then heated to the melting temperature of the solder, thus permanently bonding the sensor die to the pedestal.

The bottom surface 17 of the substrate 3 includes a printed metal pad 19 annularly disposed about the through-hole. A solder 20 having a lower temperature than the indium based soldered used to bond the die (e.g., a lead-, silver-, or tin-based solder) to the pedestal 4 is either screened onto the metal pad 19, or alternately the solder 20 is dispensed as a paste on the metal pad 19 with a syringe. A metal sampling tube 5 is coaxially aligned with the through-hole 16, and made to contact the solder 20. The sensor assembly is heated again to the melting temperature of the solder 20 to provide a sensor assembly 1 with a sampling tube 5 attached.

The contact area of the bottom surface 14 of the sensor die 2 and the distal surface 15 of the pedestal 4 is less than 50% of the total area of the bottom surface of the constraint die. The height of the pedestal above the substrate top surface 21 is greater than about 75 $\mu$m to ensure there is no contact between the non-bonded portions of the substrate 3 and the sensor die 2. We have discovered that this die/substrate configuration provides substantial isolation from induced substrate stresses such as those resulting from subsequent packaging operations or from thermal gradients in the substrate. Moreover, substantial media isolation is achieved by restricting exposure of the sensor assembly 2 to just the interior surfaces of the sensor die hollow region 7, the through-hole 16 and the sampling tube 5. Neither the exterior of the sensor assembly, nor other ancillary components mounted on the substrate are exposed to the media.

Media isolation may be further enhanced by applying a prophylactic coating (not shown) to the inside surfaces of the hollow region 7 in the sensor die, the fritted glass joint 10 bonding the two parts of the die, the through-hole 16, the indium solder joint, and optionally, the low temperature solder joint, and the sampling tube 5. In one embodiment, a protective parylene film is deposited on these inside surfaces to completely isolate these surfaces from the media thus isolating the sensor assembly from any deleterious materials in the media, resulting in a significant increase in the duty life of the sensor assembly 1.

Parylene is the generic name for thermoplastic film polymers based on paraxylylene. Three precursor dimers commercially available from Advanced Surface Technology, Inc. Billerica, Mass., may be polymerized to polymers conventionally referred to as parylene N, parylene D, and parylene C, and the present invention contemplates coatings from all three. Parylene C is particularly appropriate as it exhibits superior barrier properties to solvents, corrosive liquids, and gases, and mechanical properties as compared to parylene N and parylene D. The parylene coating may be conformally deposited on the inside surfaces of the of the sensor assembly 1 by chemical vapor deposition (CVD) in a suitable pyrolysis chamber. The solid dimer is placed in the sublimation chamber and the sensor assembly 1 is placed in the deposition chamber. The apparatus is pumped down to a pressure of about 1–100 millitorr, nominally 10–30 millitorr, using a mechanical pump and a cold-finger trap. The temperature of the sublimation chamber is elevated to between 50° C. to 300° C., nominally between 100° C. to 200° C. whereby the dimer sublimes and the vapor passes into the pyrolysis chamber. Pyrolysis may be carried out by maintaining the temperature of the pyrolysis zone to between about 500° C. to 900° C., and nominally to about 650° C. The diradical formed by the pyrolysis passes into the deposition chamber where it polymerizes and condenses conformally on all unmasked surfaces of the sensor assembly. In one embodiment the conformal parylene coating is deposited to a thickness of greater than about 2000 Å, and nominally approximately about 9,000 Å.

Figure 2:
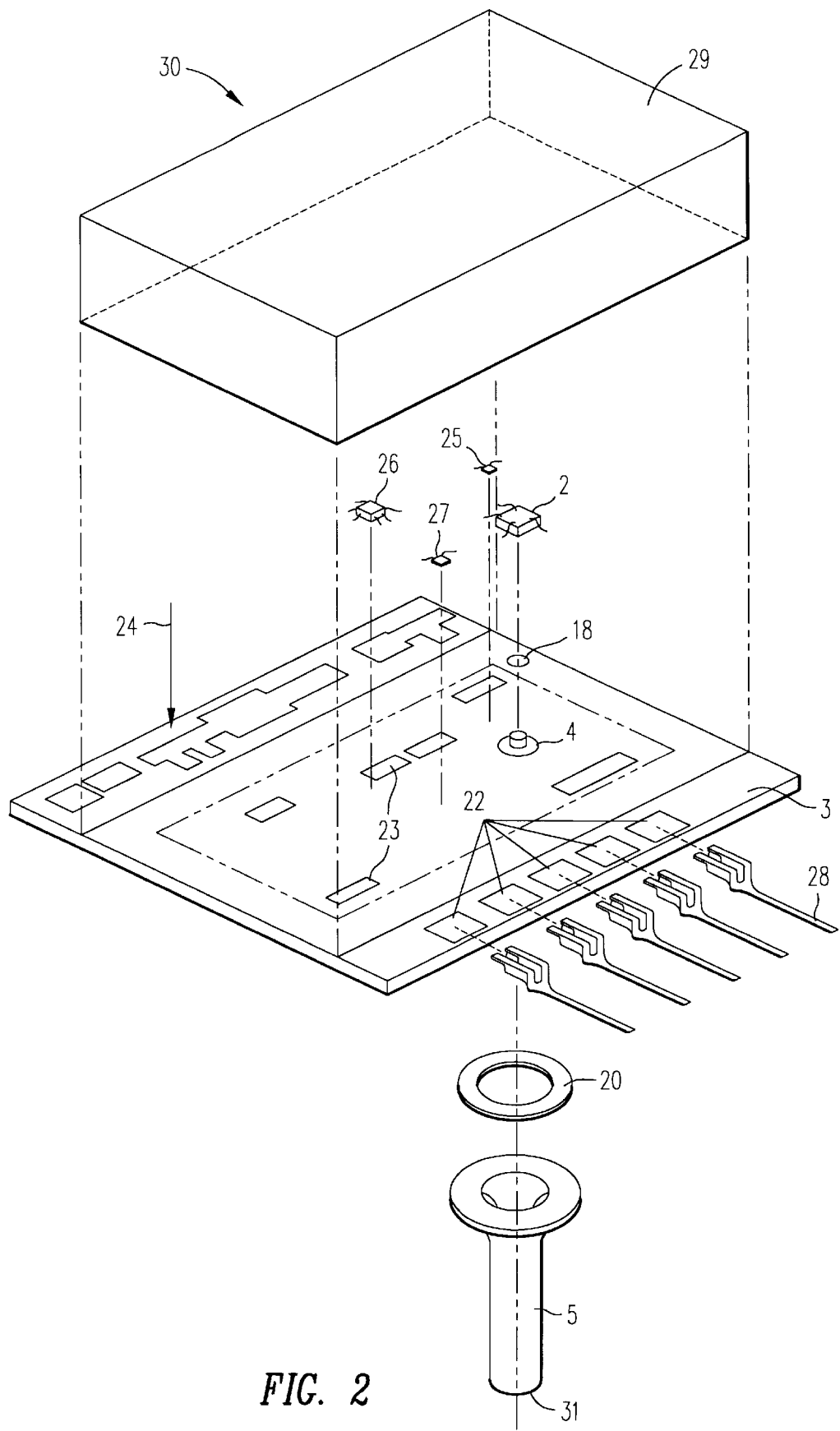
FIG. 2 is an exploded isometric view of the sensor module containing the sensor assembly of the present invention.

Referring now to FIG. 2, a sensor module 30 including the sensor assembly of this invention is shown in an exploded isometric view. A substrate 3 is printed with the pedestal 4, electrical lead pads 22, component pads 23, film resistors 24, electrical traces (not shown), and the like to accommodate the sensor die 2, and various optional electronic components such as a transistor die 25, operational amplifier 26, voltage regulator 27, external connection leads 28, and the like. A pre-formed solder ring 20 is shown disposed between the sampling tube 5 and the substrate 3. Similarly, a pre-formed high temperature solder ring 18 is shown disposed between the sensor die 2 and the pedestal 4. A housing 29 is fitted to the substrate to provide protection from adverse ambient conditions. The housing 29 is ideally constructed from the same material as the substrate 3 to eliminate stresses resulting from different coefficients of thermal expansion. However, other materials may be used so long as its coefficient of thermal expansion is approximately equal to that of the substrate. The sensor module 30 is operated by connecting the distal end 31 of the sampling tube 5 to a media stream. Electrical indications of the values of the physical characteristic being measured are received from the external leads 28.

Figure 3:
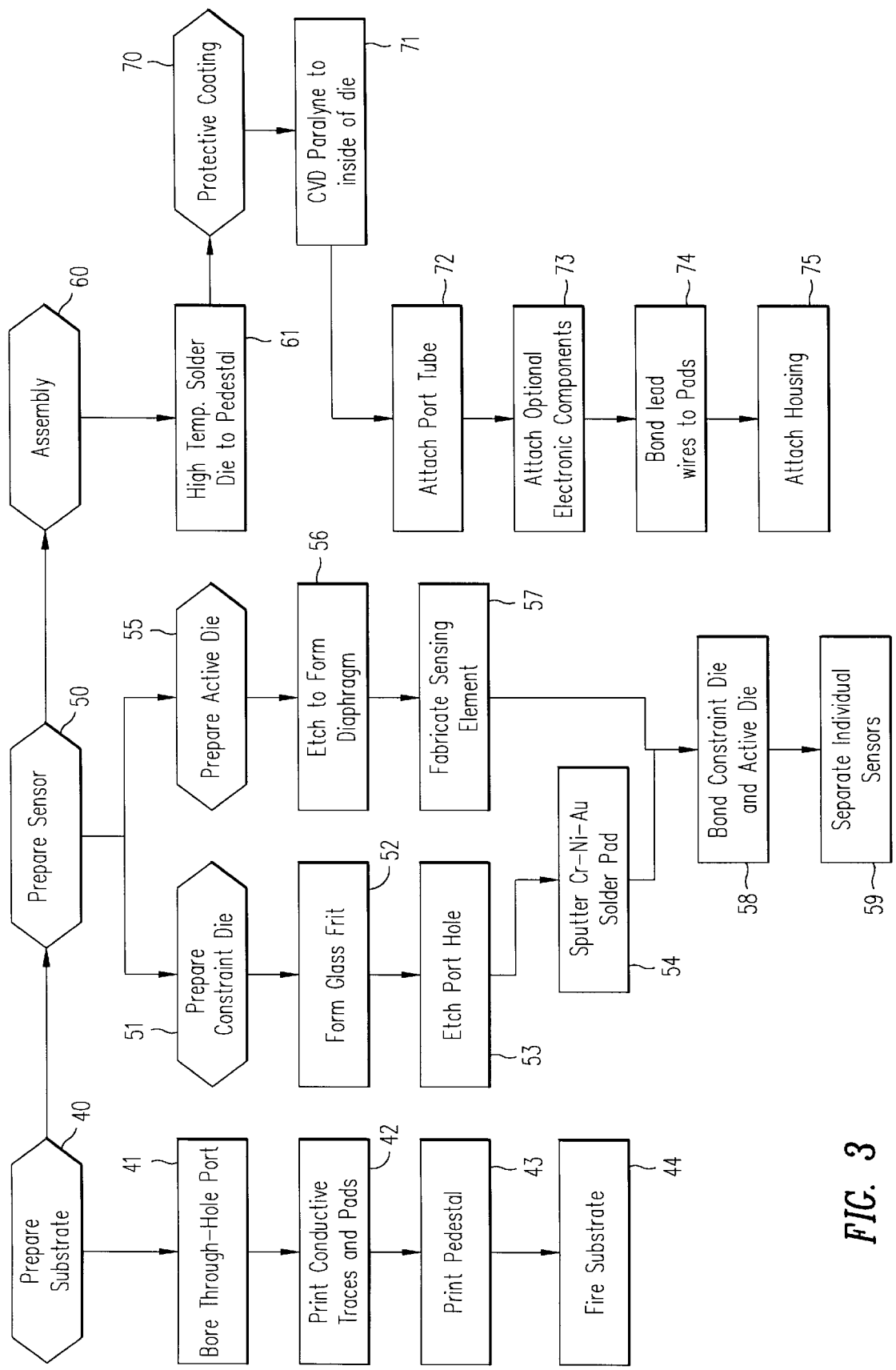
FIG. 3 is a process flow diagram of the process steps comprising the method of this invention.

The method in accordance with this invention to make the sensor assembly is shown in flowchart form in FIG. 3. Four principle operations characterize the process of the method for making a pressure sensor assembly: preparing the substrate 40, preparing the sensor 50, assembling the sensor and the substrate 60, and applying the prophylactic coating 70.

Preparation of the substrate 40 includes boring 41 the through hole at the precise location that the sensor die is to be mounted, and printing 42 the conductive solder pads, electrical pads, and electrical traces onto the ceramic substrate. The pedestal is printed 43 during the same process operation as printing the conductive elements at step 42. A printed metal top pedestal surface is provided to ensure solderability to the sensor die. The substrate is fired 44 at this point to remove the solvents and binders from the printed materials.

Preparation of the constraint die at step 51 includes forming a glass frit 52 on the top surface of the constraint die wafer, etching a port hole 53 in the constraint die, sputtering a patterned soldering pad 54 onto the bottom surface of the constraint die. Preparation of the active die 55 includes the steps of etching the die 56 to form a hollowed region, and a flexible diaphragm. A piezoresistive transducer element is formed at step 57 in the top surface of the active die using well known photolithographic and semiconductor fabrication techniques. The top surface of the constraint die is bonded to the bottom surface of the active die at step 58. The two die halves are joined, the temperature is increased, and the two halves are fused together by the glass frit. The individual sensors are sawn from the wafer sandwich at step 59.

The sensor die is assembled 60 to the pedestal using a high temperature solder. The solder may be printed onto the top surface of the pedestal, provided as a solder ring which is inserted between the pedestal and the sensor die, or applied directly to the pedestal using a syringe. The port in the bottom surface of the sensor die is carefully coaxially aligned with the through-hole in the pedestal and the temperature is raised to melt the solder thus bonding the sensor to the pedestal at step 61.

A protective prophylactic coating may be applied 70 at this time to the interior surfaces of the die and the through hole, including the high temperature solder joint and the glass frit joint. Parylene is chemically vapor deposited on these inside surfaces. The process steps are described in detail above. Alternately, this step 71 may be deferred until after the sampling tube is attached if a protective coating is also desired on the interior surface of the sampling tube and the low temperature solder joint whereby the sampling tube is attached 72 to the bottom surface of the substrate.

Final assembly includes the conventional steps of mounting optional electronic components 73, bonding lead wires to the appropriate pads 74, and attaching the housing 75.

In view of the foregoing, it will be understood that the present invention provides a sensor assembly having both media isolation and induced stress isolation. Isolation from induced stress results from our discovery of the novel structure described in the disclosure whereby the sensor die is attached to a boss region on the substrate surface, the attachment area representing less than 50% of the total area of the bottom surface of the sensor die, and the height of the boss being at least 75 $\mu$m. Media isolation is provided by our novel sensor assembly design which restricts media contact with the sensor element to a hollow region and through-tube of the sensor assembly, thus avoiding any contact to other sensor elements such as wire traces, electrical components, and the like to the media. Complete media isolation is attained by applying a protective prophylactic coating to the interior surfaces of the sensor assembly that are in contact with the media, including the interior surfaces of the hollow region in the sensor die, the glass joint, the high temperature solder joint, the through-hole, and optionally, the low temperature solder joint, and the sampling tube. It will also be evident that the novel features of the sensor assembly described in the Detailed Description can be extended to include other kinds of sensor assemblies including thermal, flow, and acceleration sensor assemblies.

What is claimed is:

1. A sensor assembly comprising:
   a) a substrate having a top surface and a bottom surface;
   b) a boss formed on said substrate and bonded to said substrate, said boss extending from said top surface of said substrate to terminate in a planar distal end;
   c) a sensor die having a bottom surface, and a top surface, at least a portion of said sensor die bottom surface being bonded to said distal end of said boss;
      wherein said sensor die defines a hollow region in said sensor die, and at least one port to permit fluid communication to said hollow region, and wherein said substrate defines at least one through-hole extending from said bottom surface of said substrate and approximately coaxial with a longitudinal axis of said boss, and terminating in cooperative coaxial alignment with said port thereby to permit fluid communication of said through-hole with said port;
      wherein said hollow region includes an interior surface and said through-hole includes an interior surface, said sensor assembly further comprising a prophylactic coating deposited on said interior surfaces thereby to substantially isolate said interior surfaces from media disposed within said hollow region and said through-hole.

2. A sensor assembly as in claim 1 wherein said portion of said sensor die bottom surface bonded to said boss distal end is less than about 50% of the total surface area of said sensor die bottom surface.

3. A sensor assembly as in claim 1 wherein said boss comprises a different material than said substrate.

4. A sensor assembly as in claim 3 wherein said boss comprises a material selected from the group consisting of glass, ceramic, metal, sintered metal, silicon, silicon oxide, silicon nitride, silicones, thermosetting polymers, sinterable metals, glass, and ceramic inks, sinterable glass, ceramic, and metal pastes, and combinations thereof.

5. A sensor assembly as in claim 4 wherein said boss is formed from a metal ink.

6. A sensor assembly as in claim 1 wherein said prophylactic coating is selected from the group consisting of silicon dioxide, silicon nitride, polymerized para-xylylene, fluorocarbon polymers, insoluble metal halide salts, and combinations thereof.

7. A sensor assembly as in claim 6 further comprising at least one sampling tube mounted to said substrate bottom surface, said sampling tube defining an open hollow region therein, said sampling tube hollow region being in cooperative, coaxial alignment and in fluid communication with said through-hole.

8. A sensor assembly as in claim 7 wherein said sampling tube hollow region includes an interior surface, said sampling tube interior surface having a prophylactic coating deposited thereon thereby to substantially isolate said sampling tube interior surface from media disposed in said sampling tube hollow region.

9. A substrate for mounting a sensor die thereon, and comprising a boss layer, said boss layer formed on a portion of a top surface of said substrate to provide a rigid, raised structure having a height sufficient to permit attachment of the sensor die thereon in remote, fixed spatial alignment with the substrate, wherein said boss layer is formed of a metal ink and defines a boss relief of at least 50 microns.

10. The substrate of claim 9 wherein said boss layer includes a distal surface for attachment to a bottom surface of the sensor die, said distal surface having an area equal to less than about 50% of said bottom surface of the sensor die.

11. The substrate of claim 10 wherein said distal surface of said boss layer comprises a metal layer to permit solder attachment of said distal surface to the sensor die, the sensor die includes a cooperating opposite solderable surface to permit solder attachment to said boss layer distal surface.

12. The substrate of claim 9 wherein the substrate defines at least one through-hole extending from a bottom surface of said substrate and approximately coaxial with a longitudinal axis of said boss layer, and terminating at said distal surface to permit communication of a fluid through said through-hole.

13. The substrate of claim 9 wherein said boss layer is formed from a material different from the substrate, said material selected from the group consisting of glass, ceramic, metal, sintered metal, silicon, silicon oxide, silicon nitride, silicones, thermosetting polymers, and sinterable metals, glass, and ceramic inks, and sinterable glass, ceramic, and metal pastes, and combinations thereof.

14. The substrate of claim 13 wherein said material is a metal ink.

15. A sensor module for measuring a characteristic of a fluid media comprising:
   a) a sensor assembly comprising:
      i) a sensor die defining an enclosed hollow region disposed therein for receiving the media, and at least one port to permit fluid communication with said sensor die hollow region, wherein said sensor die includes a transducer responsive to the characteristic of the media disposed in said sensor die hollow region;
      ii) a substrate comprising a boss formed on a portion of a top surface of said substrate, said boss extending from said top surface of said substrate and including a distal surface for attachment to a bottom surface of said sensor die, said substrate defining at least one through-hole for conveying media to said hollow region of said sensor die, the through-hole extending from a bottom surface of said substrate and approximately coaxial with a longitudinal axis of said boss, and terminating at said distal surface in cooperative coaxial alignment and in fluid communication with said sensor die port; and
      iii) a sampling tube, extending from a bottom surface of said substrate and in coaxial alignment with said through-hole thereby to permit attachment of the sensor module to a fluid media stream;
   b) connections for electrical communication to the sensor module
   c) a housing to enclose said sensor assembly; and
   d) a prophylactic coating disposed on interior surfaces of at least one of said sensor die, said through hole, and said sampling tube thereby to isolate the sensor module from the media.

16. A sensor module as in claim 15 wherein said prophylactic coating is selected from the group consisting of silicon dioxide, silicon nitride, polymerized para-xylylene, fluorocarbon polymers, and combinations thereof.

17. A sensor module as in claim 16 wherein said prophylactic coating is polymerized para-xylylene.

18. A sensor module of claim 15 wherein said boss is formed from a material different from said substrate, said material selected from the group consisting of glass, ceramic, metal, sintered metal, silicon, silicon oxide, silicon nitride, silicones, thermosetting polymers, and sinterable metals, glass, and ceramic inks, and sinterable glass, ceramic, and metal pastes, and combinations thereof.

19. A sensor module as in claim 18 wherein said material is a metal ink.

20. A sensor module as in claim 15 wherein said distal surface of said boss comprises a metal layer to permit solder attachment of said distal surface to said sensor die, and said sensor die includes a cooperating opposite solderable surface thereby to permit solder attachment to said boss distal surface.

21. A method for environmentally isolating an interior of a sensor assembly, comprising the acts of:
   a) providing a sensor die defining a hollow region therein for receiving a media, and having at least one port on the bottom surface of said sensor die for permitting fluid communication of the media with said hollow region;
   b) providing a substrate;
   c) forming a boss on said substrate, said boss having a distal surface, and said substrate defining at least one through-hole extending through said substrate, approximately centrally, coaxially through said boss and terminating at said distal surface;
   d) bonding the bottom surface of said sensor die to said distal surface of said boss, whereby the through-hole is in cooperative coaxial alignment with the sensor die port thereby permitting media to enter the hollow region in the sensor die by way of the through-hole; and
   e) coating the interior surface of at least one of the sensor die hollow region, the through hole, and the sampling region thereby to substantially isolate the sensor assembly from the media.

22. The method of claim 21 further comprising the act of bonding a sampling tube to the bottom surface of the substrate to permit connection of the sensor assembly to a media stream.

23. A method for environmentally isolating an interior of a sensor assembly, comprising the acts of:
   a) providing a sensor die defining a hollow region therein for receiving a media, and having at least one port on the bottom surface of said sensor die thereby permitting a fluid communication of the media with said hollow region;
   b) providing a substrate;
   c) forming a boss on said substrate, said boss having a distal surface, said substrate defining at least one through-hole extending through said substrate, approximately centrally, coaxially through said boss and terminating at the distal surface;
   d) bonding the bottom surface of the sensor die to said distal surface of said boss, whereby the through-hole is in cooperative coaxial alignment with the sensor die port thereby permitting media to enter the hollow region in the sensor die by way of the through-hole; and
   e) printing said boss onto said substrate to a thickness sufficient to provide a boss relief of at least 50 microns.

* * * * *